(12) United States Patent
Chen et al.

(10) Patent No.: US 12,388,351 B2
(45) Date of Patent: Aug. 12, 2025

(54) DRIVING CIRCUIT DEVICE

(71) Applicant: CHIP-GAN POWER SEMICONDUCTOR CORPORATION, Hsinchu (TW)

(72) Inventors: Ke-Horng Chen, Hsinchu (TW); Kuo-Lin Zheng, Hsinchu (TW); Yu-Chou Ko, Hsinchu (TW); Ke-Ming Su, Hsinchu (TW); Ying-Feng Wu, Hsinchu (TW)

(73) Assignee: Chip-GaN Power Semiconductor Corporation, Hsinchu (TW)

( * ) Notice: Subject to any disclaimer, the term of this patent is extended or adjusted under 35 U.S.C. 154(b) by 78 days.

(21) Appl. No.: 18/505,318

(22) Filed: Nov. 9, 2023

(65) Prior Publication Data
US 2024/0372459 A1 Nov. 7, 2024

(30) Foreign Application Priority Data
May 4, 2023 (TW) .................. 112116584

(51) Int. Cl.
*H02M 1/084* (2006.01)
*G05F 3/26* (2006.01)
*H03F 3/45* (2006.01)

(52) U.S. Cl.
CPC ............ *H02M 1/084* (2013.01); *G05F 3/262* (2013.01); *H03F 3/45179* (2013.01); *H03F 2203/45288* (2013.01)

(58) Field of Classification Search
CPC .... H02M 1/084; H02M 1/0006; H02M 1/088; H02M 1/123; G05F 3/262;
(Continued)

(56) References Cited

U.S. PATENT DOCUMENTS 6,549,074 B2 * 4/2003 Ugajin ................ H03F 3/45659
330/253
9,379,672 B2 6/2016 Ciubotaru
(Continued)

FOREIGN PATENT DOCUMENTS

CN 208079042 U 11/2018

OTHER PUBLICATIONS

Si-Yi Li et al.; "A High Common-Mode Transient Immunity GaN-on-SOI Gate Driver for High dV/dt SiC Power Switch"; Presented at IEEE on Feb. 21, 2023.
(Continued)

*Primary Examiner* — Jung Kim
(74) *Attorney, Agent, or Firm* — Rosenberg, Klein & Lee

(57) ABSTRACT

A driving circuit device includes a first current source, a second current source, a first common-mode current elimination (CMCE) circuit, a second common-mode current elimination (CMCE) circuit, a current-to-voltage converter, and a first comparator. The current sources provide constant currents. The current-to-voltage converter includes a first current mirror and a second current mirror. The control terminal of the first current mirror is coupled to the second CMCE circuit. The control terminal of the second current mirror is coupled to the first CMCE circuit. The first current mirror and the second current mirror receive the constant currents, common-mode currents, and differential currents, thereby controlling the first CMCE circuit and the second CMCE circuit to generate a voltage difference that excludes a common-mode voltage corresponding to the common-mode currents. The first comparator receives the voltage difference to drive a field-effect transistor.

10 Claims, 11 Drawing Sheets

(58) Field of Classification Search
CPC ....... H03F 3/45179; H03F 2203/45288; H03F 3/45273; H03F 3/45183; H03F 3/45188; G11C 7/062; G11C 7/06; H03K 5/2445; H03K 5/2481; H03K 5/2472; G01R 19/0038
See application file for complete search history.

(56) References Cited

U.S. PATENT DOCUMENTS

2014/0167851 A1  6/2014  Pan et al.
2021/0036896 A1  2/2021  Petrie et al.

OTHER PUBLICATIONS

Office Action mailed to Taiwanese Counterpart Patent Application No. 112116584 on Jan. 29, 2024.

* cited by examiner

DRIVING CIRCUIT DEVICE

BACKGROUND OF THE INVENTION

This application claims priority for the TW patent application No. 112116584 filed on 4 May 2023, the content of which is incorporated by reference in its entirely.

FIELD OF THE INVENTION

The invention relates to an electrical device, particularly to a power converter.

DESCRIPTION OF THE RELATED ART

Silicon carbide (SiC) metal-oxide-semiconductor effect-field transistor (MOSFET) devices offer better performance in high voltage (HV) and high current applications, such as electric vehicles, railways, and motor drives due to their low losses, low impedance, high blocking voltage, and good high temperature tolerance. Recently, the rated 1700V SiC is used in a power conversion system (PCS) for efficient energy storage. Compared to 800V and 1200V SiCs, high voltage and fast switching SiC MOSFET will cause large dv/dt>100 kV/μs and di/dt>10 kA/μs.

FIG. 1(a) is a diagram schematically illustrating a conventional gate driver. Please refer to FIG. 1(a). The gate driver is coupled to a high-side field-effect transistor (FET) 10 and a low-side field-effect transistor (FET) 11. The sources of the high-side FET 10 and the low-side FET 11 are respectively coupled to parasitic inductors 12 and 13. The gate driver includes a high-side transmitter circuit 20, a low-side transmitter circuit 21, a high-side receiver circuit 22, a low-side receiver circuit 23, and isolation barrier parasitic capacitors 24. High dv/dt at the switch node will couple the common-mode transient (CMT) disturbances to the high-side transmitter circuit 20 through the isolation barrier parasitic capacitor 24. Meanwhile, a large di/dt on the parasitic inductor 13 will cause abnormal ringing and couple to the low-side transmitter circuit 21 through the isolation barrier parasitic capacitor 24. Although the isolated gate drivers (IGD) with the transformer galvanic isolation have good common-mode transient immunity (CMTI), their duty cycle is limited to 50% due to the regeneration of the drive voltage being controlled by the duty cycle. In contrast, capacitive isolation is not limited by the duty cycle, but instead, requires the modulator at the transmitter circuit to transmit the drive signal. FIG. 1(b) is a diagram schematically illustrating a conventional demodulation circuit. Please refer to FIG. 1(a) and FIG. 1(b). When CMT disturbance occurs, a common-mode current $I_{CM}$, proportional to dv/dt at the switching node, flows through the isolation barrier parasitic capacitor 24 to the high-side transmitter circuit 20 and affects the demodulation circuit 25 of the receiver circuit 22. The dv/dt ranges from over 100 kV/μs for 1700V SiC to 40 kV/μs for 800V SiC. In the case of large resistance of a resistor 26, the common-mode current $I_{CM}$ will cause large common-mode shift (CMS). This is because CMS=$I_{CM}$×the resistance of the resistor 26. A large CMS can cause the voltage $V_{IP}$ or $V_{IN}$ to exceed the input common-mode range (ICMR) and the demodulation circuit 25 cannot receive the correct control signal for some CMT periods. Due to the absence of correct control signals, fault tolerance mechanisms can limit the runtime within a hysteresis window. However, under high voltage, the noise coupling to the gate of the low-side FET 11, through the gate-to-drain capacitance, will become larger due to the higher dv/dt, which will increase the possibility of abnormal turn-on.

To overcome the abovementioned problems, the invention provides a driving circuit device, so as to solve the aforementioned problems of the prior art.

SUMMARY OF THE INVENTION

The invention provides a driving circuit device, which avoids common-mode transient (CMT) disturbances.

In an embodiment of the invention, a driving circuit device is coupled to a field-effect transistor (FET). The driving circuit device includes a first current source, a second current source, a first common-mode current elimination (CMCE) circuit, a second common-mode current elimination (CMCE) circuit, a current-to-voltage converter, and a first comparator. The first current source and the second current source are configured to provide constant currents. The current-to-voltage converter includes a first current mirror and a second current mirror. The control terminal of the first current mirror is coupled to the second CMCE circuit. The control terminal of the second current mirror is coupled to the first CMCE circuit. The first current mirror is coupled to the first current source. The second current mirror is coupled to the second current source. The first CMCE circuit and the first current mirror are coupled to a common-mode node through a first resistor. The second CMCE circuit and the second current mirror are coupled to the common-mode node through a second resistor. The first mirror and the second mirror are configured to receive the constant currents, common-mode currents, and differential currents, thereby controlling the first CMCE circuit and the second CMCE circuit to generate a voltage difference that excludes a common-mode voltage corresponding to the common-mode currents. The first comparator is coupled to the gate of the FET, the first CMCE circuit, and the second CMCE circuit and configured to receive the voltage difference to drive the FET.

In an embodiment of the invention, each of the first CMCE circuit and the second CMCE circuit includes three depletion mode GaN-based N-channel metal-oxide-semiconductor field-effect transistors coupled in series.

In an embodiment of the invention, the driving circuit device further includes a driving controller, a negative voltage generator, and a level shifter. The driving controller is coupled to a first high-voltage terminal and the gate of the FET. The negative voltage generator, coupled to the driving controller and a low-voltage terminal, includes a capacitor. The level shifter is coupled to the first comparator, the driving controller, and the negative voltage generator. The first comparator is configured to generate a pulse width modulation (PWM) voltage signal according to the voltage difference and transmit the PWM voltage signal to the level shifter. When the PWM voltage signal is a high-level voltage, the level shifter drives the driving controller and the negative voltage generator to charge the capacitor, thereby generating a non-negative voltage. When the PWM voltage signal is a low-level voltage, the level shifter drives the negative voltage generator to discharge the capacitor, thereby generating a negative voltage. The driving controller is configured to receive the negative voltage to turn off the FET.

In an embodiment of the invention, the negative voltage generator further includes a first diode, a resistor, an electronic switch, and a second diode. The anode of the first diode is coupled to the driving controller and the FET. The resistor is coupled between the capacitor and the cathode of the first diode. The control terminal of the electronic switch is coupled to the level shifter. The electronic switch is coupled between the cathode of the first diode and the low-voltage terminal. The anode of the second diode is coupled to the driving controller and the capacitor. The cathode of the second diode is coupled to the low-voltage terminal. When the PWM voltage signal is the high-level voltage, the level shifter turns off the electronic switch and drives the driving controller to charge the capacitor. When the PWM voltage signal is the low-level voltage, the level shifter turns on the electronic switch to charge the capacitor.

In an embodiment of the invention, the driving controller includes at least one first N-channel metal-oxide-semiconductor field-effect transistor (NMOSFET) and at least one second N-channel metal-oxide-semiconductor field-effect transistor (NMOSFET). The gate of the first NMOSFET is coupled to the level shifter. The first NMOSFET is coupled between the first high-voltage terminal and the gate of the FET. When the PWM voltage signal is the high-level voltage, the level shifter turns on the first NMOSFET and the first high-voltage terminal charges the capacitor through the first NMOSFET. The gate of the second NMOSFET is coupled to a grounding terminal. The second NMOSFET is coupled between the capacitor and the gate of the FET. When the PWM voltage signal is the low-level voltage, the second NMOSFET receives the negative voltage to turn off the FET.

In an embodiment of the invention, the first NMOSFET and the second NMOSFET are enhancement mode GaN-based N-channel metal-oxide-semiconductor field-effect transistors (NMOSFET).

In an embodiment of the invention, the driving circuit device includes a voltage sensor, a voltage tracker, and a control circuit. The voltage sensor is coupled to the first comparator, the level shifter, the gate of the FET, a second high-voltage terminal, and the low-voltage terminal and coupled to the high voltage of the second high-voltage terminal, the low voltage of the low-voltage terminal, the gate voltage of the FET, the PWM voltage signal, and the output voltage of the level shifter. When the PWM voltage signal transitions from the low-level voltage to the high-level voltage, the gate voltage starts to rise. When the gate voltage is greater than the low voltage, the voltage sensor generates a turn-off voltage. The voltage tracker is coupled to the drain of the FET and the second high-voltage terminal, coupled to the drain voltage of the FET and the high voltage of the second high-voltage terminal, and configured to generate a sensing voltage according to the drain voltage and the high voltage of the second high-voltage terminal. The control circuit is coupled to the gate of the FET, the second high-voltage terminal, the level shifter, the voltage sensor, and the driving controller. The driving controller is configured to generate a supplying current to increase the gate voltage of the FET. The control circuit is coupled to the high voltage of the second high-voltage terminal, the gate voltage, the output voltage, and the sensing voltage. When the control circuit receive the turn-off voltage, the control circuit controls the driving controller to decrease the supplying current from a first current value to a second current value. When the sensing voltage is less than a first voltage, the control circuit controls the driving controller to decrease the supplying current to a third current value less than the second current value. When the sensing voltage is greater than the first voltage, the control circuit and the voltage sensor control the driving controller to generate the supplying current of the first current value until the gate-source voltage of the FET is equal to the high voltage of the first high-voltage terminal.

In an embodiment of the invention, the voltage sensor includes a first SR flip-flop, a delayer, a first one-shot (OS) circuit, a second comparator, a first electronic switch, a second electronic switch, a second one-shot (OS) circuit, a second SR flip-flop, and a third SR flip-flop. The delayer is coupled to the first comparator and the S input of the first SR flip-flop and coupled to the PWM voltage signal. The first OS circuit is coupled to the R input of the first SR flip-flop. The second comparator is coupled to the second high-voltage terminal. The positive input of the second comparator is coupled to the gate of the FET and coupled to the gate voltage. The first electronic switch is coupled between the low-voltage terminal and the negative input of the second comparator. The control terminal of the first electronic switch is coupled to the Q output of the first SR flip-flop. The second electronic switch is coupled between the negative input and the positive input of the second comparator. The second OS circuit is coupled to the level shifter and coupled to the output voltage of the level shifter. The S input of the second SR flip-flop is coupled to the output of the second comparator. The R input of the second SR flip-flop is coupled to the second OS circuit. The S input of the third SR flip-flop is coupled to the control circuit. The R input of the third SR flip-flop is coupled to the Q output of the second SR flip-flop, the control terminal of the second electronic switch, and the first OS circuit. The Q output of the third SR flip-flop is coupled to the control circuit and configured to generate the turn-off voltage.

In an embodiment of the invention, the control circuit includes a voltage-dividing circuit, a third comparator, a fourth comparator, a first AND gate, a second AND gate, and a third AND gate. The voltage-dividing circuit is coupled to the second high-voltage terminal and the gate of the FET, coupled to the gate voltage and the high voltage of the second high-voltage terminal, and configured to provide the first voltage and a second voltage less than the first voltage. The negative input of the third comparator is coupled to the voltage-dividing circuit and coupled to the second voltage. The positive input of the third comparator is coupled to the voltage tracker and coupled to the sensing voltage. The negative input of the fourth comparator is coupled to the voltage-dividing circuit and coupled to the first voltage. The positive input of the fourth comparator is coupled to the voltage tracker and coupled to the sensing voltage. The inputs of the first AND gate are coupled to the outputs of the third comparator and the fourth comparator. The output of the first AND gate is coupled to the S input of the third SR flip-flop. The inputs of the second AND gate are coupled to the output of the first AND gate and the level shifter and coupled to the output voltage. The output of the second AND gate is coupled to the driving controller. The inputs of the third AND gate are coupled to the voltage sensor and the output of the second AND gate. The output of the third AND gate is coupled to the driving controller.

In an embodiment of the invention, the voltage tracker includes a capacitor, a resistor, and a diode. The capacitor has a first end and a second end. The first end is coupled to the positive inputs of the third comparator and the fourth comparator. The second end is coupled to the drain of the FET and coupled to the drain voltage. The resistor is coupled between the first end and the second high-voltage terminal. The anode of the diode is coupled to the first end and the positive inputs of the third comparator and the fourth comparator. The cathode of the diode is coupled to the second high-voltage terminal and coupled to the high voltage of the second high-voltage terminal. The capacitor is configured to generate the sensing voltage at the first end according to the drain voltage and the high voltage of the second high-voltage terminal.

To sum up, the driving circuit device employs the CMCE circuits crossly coupled and the current mirrors of the current-to-voltage converter to avoid the CMT disturbances.

Below, the embodiments are described in detail in cooperation with the drawings to make easily understood the technical contents, characteristics and accomplishments of the invention.

DETAILED DESCRIPTION OF THE INVENTION

Figures 1A, 1B:
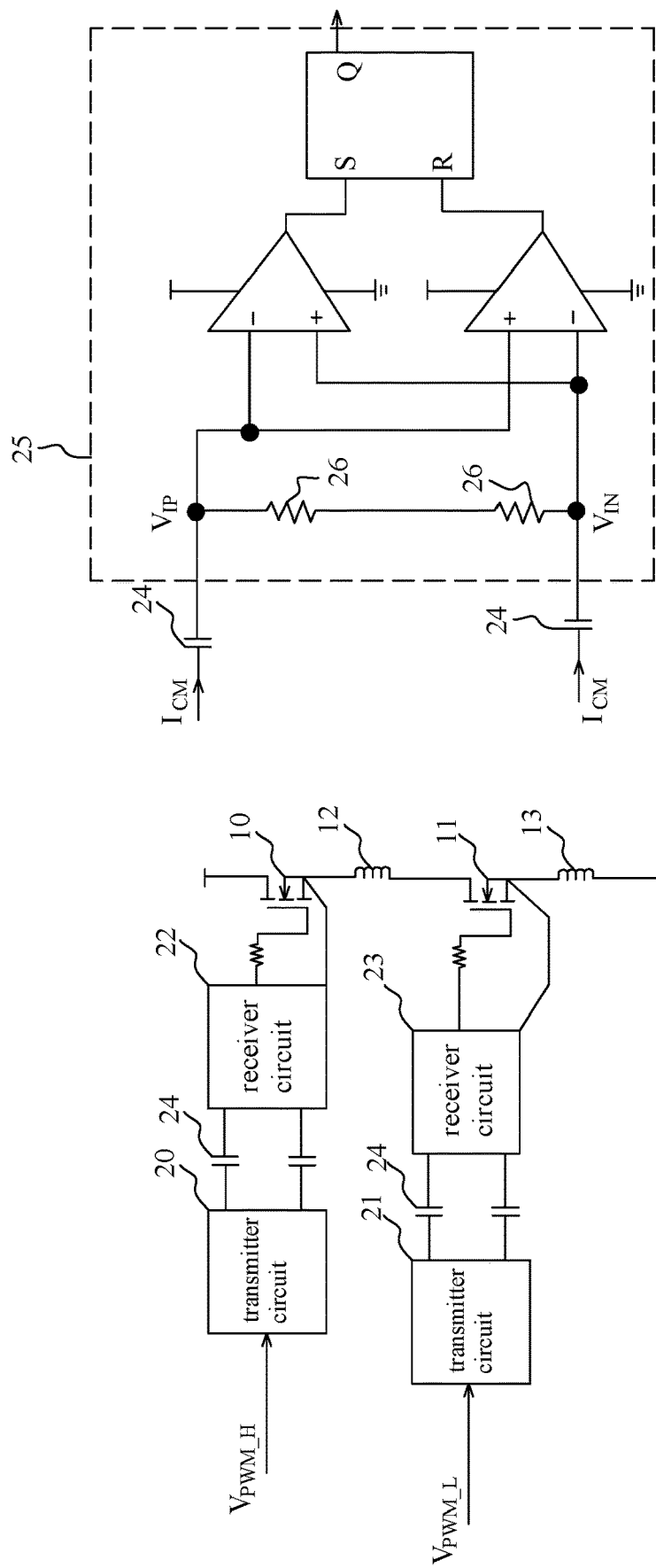
FIG. 1(a) is a diagram schematically illustrating a conventional gate driver.
FIG. 1(b) is a diagram schematically illustrating a conventional demodulation circuit.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/ without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Figure 2:
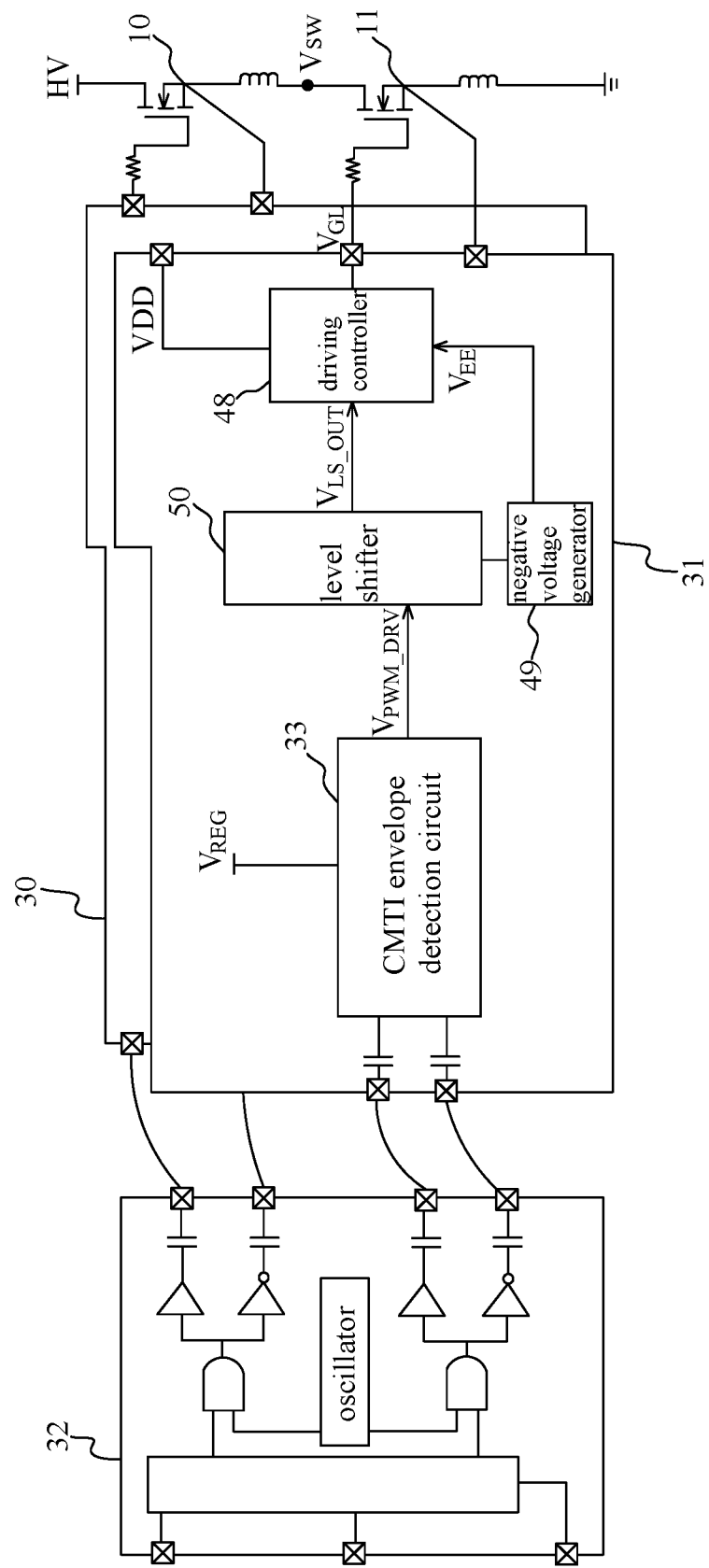
FIG. 2 is a diagram schematically illustrating a driving circuit device according to an embodiment of the invention.
Figure 3:
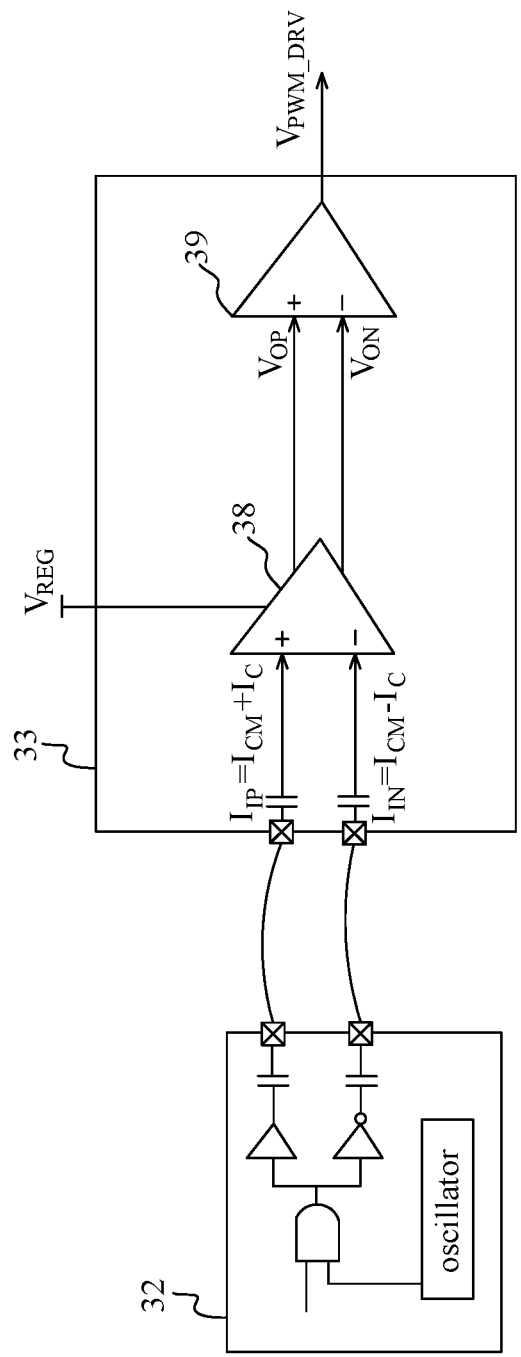
FIG. 3 is a diagram schematically illustrating a receiver circuit and a transmitter circuit according to an embodiment of the invention.
Figure 4:
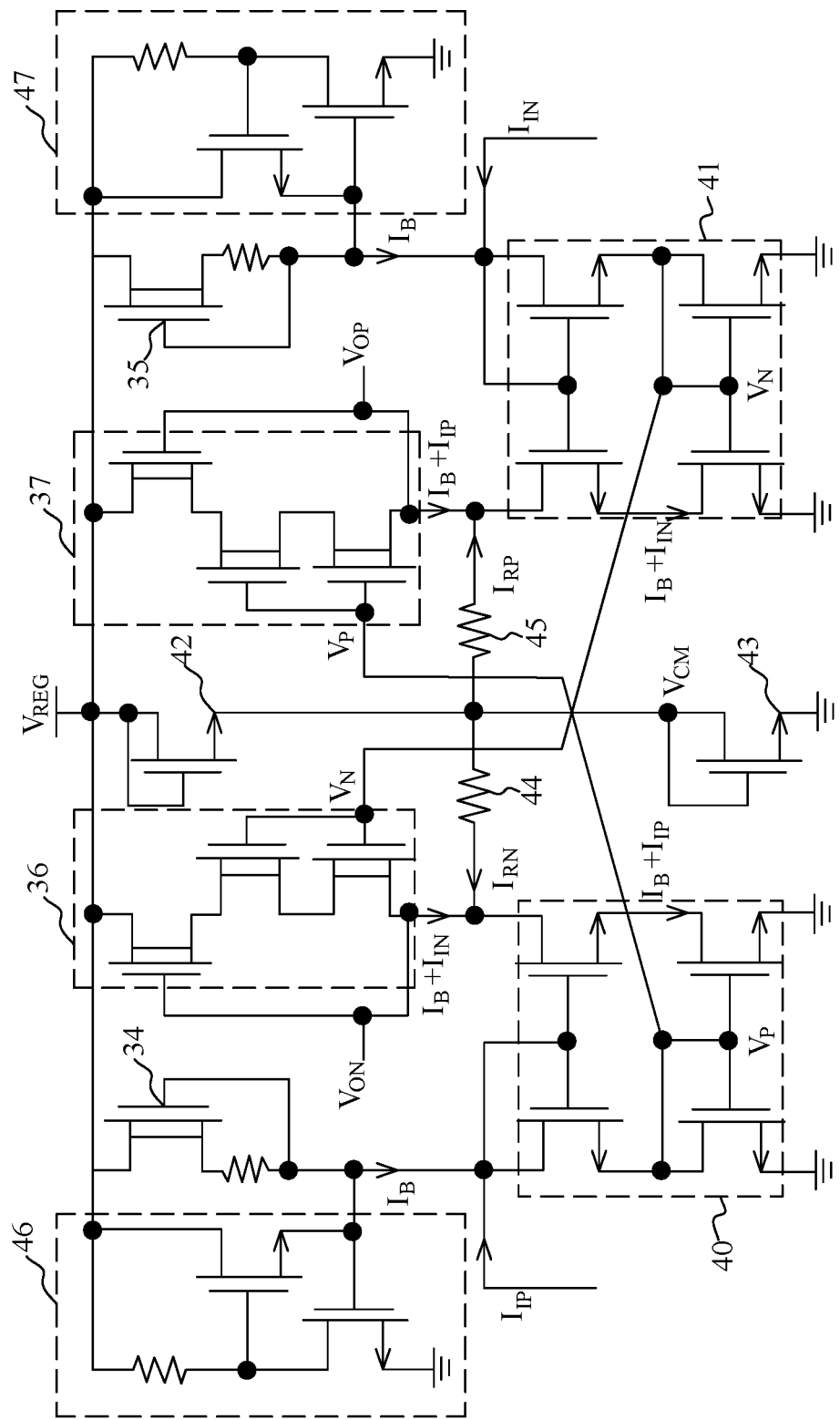
FIG. 4 is a diagram schematically illustrating a common-mode transient immunity (CMTI) envelope detection circuit according to an embodiment of the invention.

FIG. 2 is a diagram schematically illustrating a driving circuit device according to an embodiment of the invention. FIG. 3 is a diagram schematically illustrating a receiver circuit and a transmitter circuit according to an embodiment of the invention. FIG. 4 is a diagram schematically illustrating a common-mode transient immunity (CMTI) envelope detection circuit according to an embodiment of the invention. Referring to FIG. 2, FIG. 3, and FIG. 4, a driving circuit device is introduced as follows. The driving circuit device is coupled to a high-side field-effect transistor (FET) 10 and a low-side field-effect transistor (FET) 11. The driving circuit device may include a high-side receiver chip 30, a low-side receiver chip 31, and a transmitter chip 32. The high-side receiver chip 30 and the low-side receiver chip 31 are respectively coupled to the high-side FET 10 and the low-side FET 11 and coupled to the transmitter chip 32. The high-side FET 10 10 is coupled to a high voltage HV. There is a drain voltage $V_{SW}$ between the high-side FET 10 and the low-side FET 11. The high-side receiver chip 30 is the same as or similar to the low-side receiver chip 31. The low-side receiver chip 31 is used as an example for illustration below. The low-side receiver chip 31 includes a common-mode transient immunity (CMTI) envelope detection circuit 33. The CMTI envelope detection circuit 33 includes a first current source 34, a second current source 35, a first common-mode current elimination (CMCE) circuit 36, a second common-mode current elimination (CMCE) circuit 37, a current-to-voltage converter 38, and a first comparator 39. The first current source 34 and the second current source 35 are coupled to a high voltage $V_{REG}$. The high voltage $V_{REG}$ is, for example, 6 volts. The first current source 34 and the second current source 35 may include depletion mode GaN-based N-channel metal-oxide-semiconductor field-effect transistors. The base of the N-based N-channel metal-oxide-semiconductor field-effect transistor is made of GaN. The first CMCE circuit 36 and the second CMCE circuit 37 are coupled to the high voltage $V_{REG}$. Each of the first CMCE circuit 36 and the second CMCE circuit 37 may include three depletion mode GaN-based N-channel metal-oxide-semiconductor field-effect transistors coupled in series. The current-to-voltage converter 38 is coupled to the high voltage $V_{REG}$ and a grounding voltage. The current-to-voltage converter 38 includes a first current mirror 40 and a second current mirror 41. In some embodiments, the current-to-voltage converter 38 includes a first field-effect transistor 42, a second field-effect transistor 43, a first resistor 44, and a second resistor 45. The control terminal of the first current mirror 40 is coupled to the second CMCE circuit 37. The control terminal of the second current mirror 41 is coupled to the first CMCE circuit 36. The first current mirror 40 is coupled to the first current source 34. The second current mirror 41 is coupled to the second current source 35. The first CMCE circuit 36 and the first current mirror 40 are coupled to a common-mode node through the first resistor 44. The second CMCE circuit 37 and the second current mirror 41 is coupled to the common-mode node through the second resistor 45. The common-mode voltage of the common-mode node is represented with $V_{CM}$. The common-mode node is coupled between the first field-effect transistor 42 and the second field-effect transistor 43. The first field-effect transistor 42 is coupled to the high voltage $V_{REG}$. The second field-effect transistor 43 is coupled to the grounding voltage. The transistors used in the current-to-voltage converter 38 are all enhancement mode GaN-based metal-oxide-semiconductor field-effect transistors as examples, but the invention is not limited thereto. The first comparator 39 is coupled to the gate of the FET 11, the first CMCE circuit 36, and the second CMCE circuit 37.

The operation of the common-mode transient immunity envelope detection circuit 33 is introduced as follows. The first current source 34 and the second current source 35 provide constant currents $I_B$. The first current mirror 40 and the second current mirror 41 receive the constant currents $I_B$, common-mode currents $I_{CM}$, and differential currents $I_C$, and thereby controlling the first CMCE circuit 36 and the second CMCE circuit 37 to generate a voltage difference that excludes a common-mode voltage $V_{CM}$ corresponding to the common-mode currents $I_{CM}$, so as to avoid the common-mode transient interference. The first comparator 39 receives the voltage difference to generate a pulse width modulation voltage (PWM) signal $V_{PWM\_DRV}$ to drive the FET 11. Specifically, the current-to-voltage converter 38 receives input currents $I_{IN}$ and $I_{IP}$. The input current $I_{IN}=I_{CM}-I_C$ and the input current $I_{IP}=I_{CM}+I_C$. $V_P$ represents the voltage of the control terminal of the first current mirror 40. VN represents the voltage of the control terminal of the second current mirror 41. The first current mirror 40 receives the input current $I_{IP}$ and the constant current $I_B$, so that the second CMCE circuit 37 generates the input current $I_{IP}$ and the constant current $I_B$ and generates an output voltage $V_{OP}$ based on the voltage $V_P$, the input current $I_{IP}$, and the constant current $I_B$. Similarly, the second current mirror 41 receives the input current $I_{IN}$ and the constant current $I_B$, so that the first CMCE circuit 36 generates the input current $I_{IN}$ and the constant current $I_B$ and generates an output voltage $V_{ON}$ based on the voltage $V_N$, the input current $I_{IN}$, and the constant current $I_B$. Based on the Kirchhoff's law, a current $I_{RN}$ passing through the first resistor 44 and a current IRP passing through the second resistor 45 can be calculated. The resistance of the first resistor 44 is represented with $R_N$ and the resistance of the second resistor 45 is represented with $R_P$.

Figure 5B:
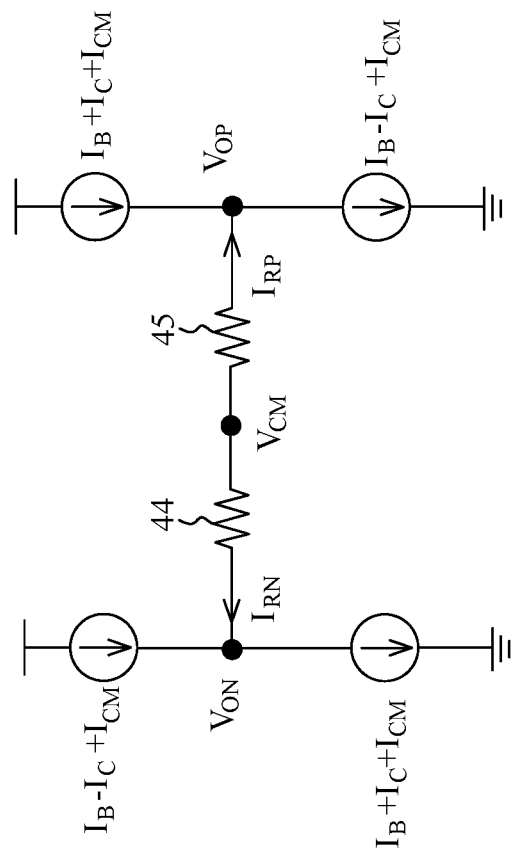
FIG. 5(b) is a diagram schematically illustrating the equivalent circuit of a common-mode transient immunity (CMTI) envelope detection circuit in a common-mode transient (CMT) state according to an embodiment of the invention.
Figure 5A:
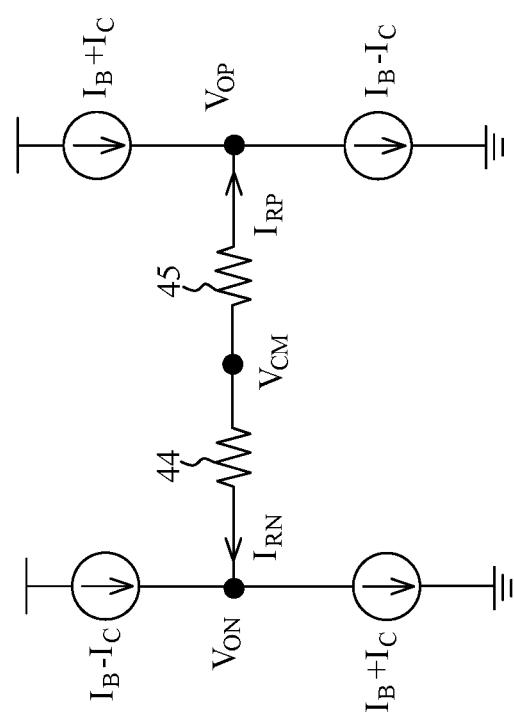
FIG. 5(a) is a diagram schematically illustrating the equivalent circuit of a common-mode transient immunity (CMTI) envelope detection circuit in a normal state according to an embodiment of the invention.

FIG. 5(a) is a diagram schematically illustrating the equivalent circuit of a common-mode transient immunity (CMTI) envelope detection circuit in a normal state according to an embodiment of the invention. In the normal state of the CMTI envelope detection circuit, $I_{CM}=0$ and the equivalent circuit of the CMTI envelope detection circuit is shown in FIG. 5(a). In the normal state, $V_{OP}=V_{CM}+2I_C \times R_P$ and $V_{ON}=V_{CM}-2I_C \times R_N$. Thus, $V_{OP}-V_{ON}=2(I_C \times R_P+I_C \times R_N)$. FIG. 5(b) is a diagram schematically illustrating the equivalent circuit of a common-mode transient immunity (CMTI) envelope detection circuit in a common-mode transient (CMT) state according to an embodiment of the invention. In the CMT state of the CMTI envelope detection circuit, the equivalent circuit of the CMTI envelope detection circuit is shown in FIG. 5(b). In the CMT state, $V_{OP}=V_{CM}+2I_C \times R_P$ and $V_{ON}=V_{CM}-2I_C \times R_N$. Thus, $V_{OP}-V_{ON}=2(I_C \times R_P+I_C \times R_N)$. Accordingly, in the normal state and the CMT state, the common-mode voltage $V_{CM}$ are equal.

Referring to FIG. 4, the current-to-voltage converter 38 may further include additional current sources 46 and 47 coupled to the high voltage $V_{REG}$. The additional current source 46 is coupled to the first current source 34 and the first current mirror 40. The additional current source 47 is coupled to the second current source 35 and the second current mirror 41. When the input directions of the input currents $I_{IP}$ and $I_{IN}$ are negative, the constant current $I_B$ cannot supply the negative input currents $I_{IP}$ and $I_{IN}$. Simultaneously, the additional current sources 46 and 47 will provide additional currents, such that the current-to-voltage converter 38 normally operates.

Figure 6:
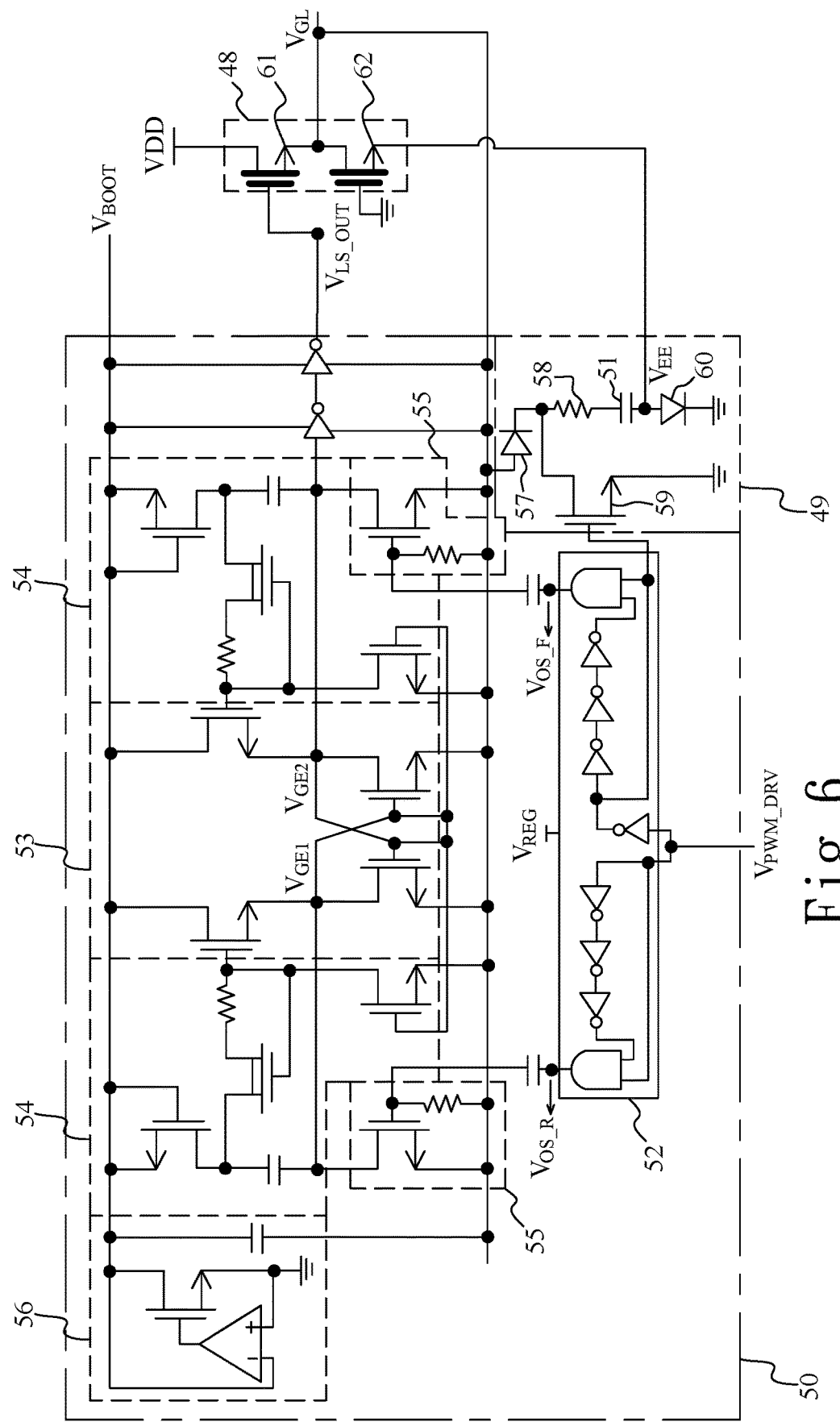
FIG. 6 is a diagram schematically illustrating a level shifter, a negative voltage generator, and a driving controller according to an embodiment of the invention.

FIG. 6 is a diagram schematically illustrating a level shifter, a negative voltage generator, and a driving controller according to an embodiment of the invention. Please refer to FIG. 2, FIG. 3, and FIG. 6. In order to avoid abnormally turning on the FET 11, the driving circuit device may further include a driving controller 48, a negative voltage generator 49, and a level shifter 50. The transistors used in the drive controller 48, the negative voltage generator 49, and the level shifter 50 are all enhancement mode or depletion mode based on GaN-based metal oxide semiconductor field-effect transistors, but the invention is not limited thereto. The driving controller 48 is coupled to a first high-voltage terminal having a high voltage VDD and the gate of the FET 11. The negative voltage generator 49 is coupled to the driving controller 48 and a low-voltage terminal, wherein the negative voltage generator 49 includes a capacitor 51. The voltage of the low-voltage terminal is exemplified by the grounding voltage, but the invention is not limited thereto. The level shifter 50 is coupled to the first comparator 39, the driving controller 48, and the negative voltage generator 49.

The first comparator 39 sends the PWM voltage signal $V_{PWM\_DRV}$ to the level shifter 50. When the PWM voltage signal $V_{PWM\_DRV}$ is a high-level voltage, the level shifter 50 drives the driving controller 48 and the negative voltage generator 49 to charge the capacitor 51 to generate a non-negative voltage. When the PWM voltage signal $V_{PWM\_DRV}$ is a low-level voltage, the level shifter 50 drives the negative voltage generator 49 to discharge the capacitor 51 to generate a negative voltage. The driving controller 48 receives the negative voltage to turn off the FET 11.

Specifically, the level shifter 50 may include a controller 52, a latch 53, charge pumps 54, transition current sinks 55, and an active diode bootstrap circuit 56. The controller 52 is coupled to the negative voltage generator 49 and the transition current sinks 55. The transition current tanks 55 are respectively coupled to the charge pumps 54. The latch 53 is coupled between the charge pumps 54. The active diode bootstrap circuit 56, the charge pumps 54, and the latch 53 are coupled to a high voltage $V_{BOOT}$. The negative voltage generator 49, the active diode bootstrap circuit 56, the transition current tanks 55, the charge pumps 54, and the latch 53 are coupled to the gate of the FET 11. The gate voltage of the FET 11 is represented with $V_{GL}$. The controller 52 is coupled to the high voltage $V_{REG}$ and the PWM voltage signal $V_{PWM\_DRV}$. There is a node voltage $V_{OS\_R}$ or $V_{OS\_F}$ between the controller 52 and each transition current sink 55. The latch 53 has node voltages $V_{GE1}$ and $V_{GE2}$.

The negative voltage generator 49 may further include a first diode 57, a resistor 58, an electronic switch 59, and a second diode 60. The anode of the first diode 57 is coupled to the driving controller 48 and the gate of the FET 11. The resistor 58 is coupled between the capacitor 51 and the cathode of the first diode 57. The control terminal of the electronic switch 59 is coupled to the controller 52 of the level shifter 50. The electronic switch 59 is coupled to the cathode of the first diode 57 between and the low-voltage terminal. The anode of the second diode 60 is coupled to the driving controller 48 and the capacitor 51. The cathode of the second diode 60 is coupled to the low-voltage terminal. A node voltage between the second diode 60 and the capacitor 51 is represented with $V_{EE}$.

The driving controller 48 may include at least one first N-channel metal-oxide-semiconductor field-effect transistor (MOSFET) 61 and at least one second N-channel metal-oxide-semiconductor field-effect transistor (MOSFET) 62. For convenience and clarity, the embodiment exemplifies one first N-channel MOSFET 61 and one second N-channel MOSFET 62. The gate of the first N-channel metal-oxide-semiconductor field-effect transistor 61 is coupled to the level shifter 50. The first N-channel metal-oxide-semiconductor field-effect transistor 61 is coupled between the first high-voltage terminal and the gate of the FET 11. The gate of the second N-channel MOSFET 62 is coupled to a grounding terminal. The second N-channel MOSFET 62 is coupled between the capacitor 51 and the gate of the FET 11. In some embodiments, the first N-channel MOSFET 61 and the second N-channel MOSFET 62 are enhancement mode GaN-based N-channel MOSFETs.

Figure 7:
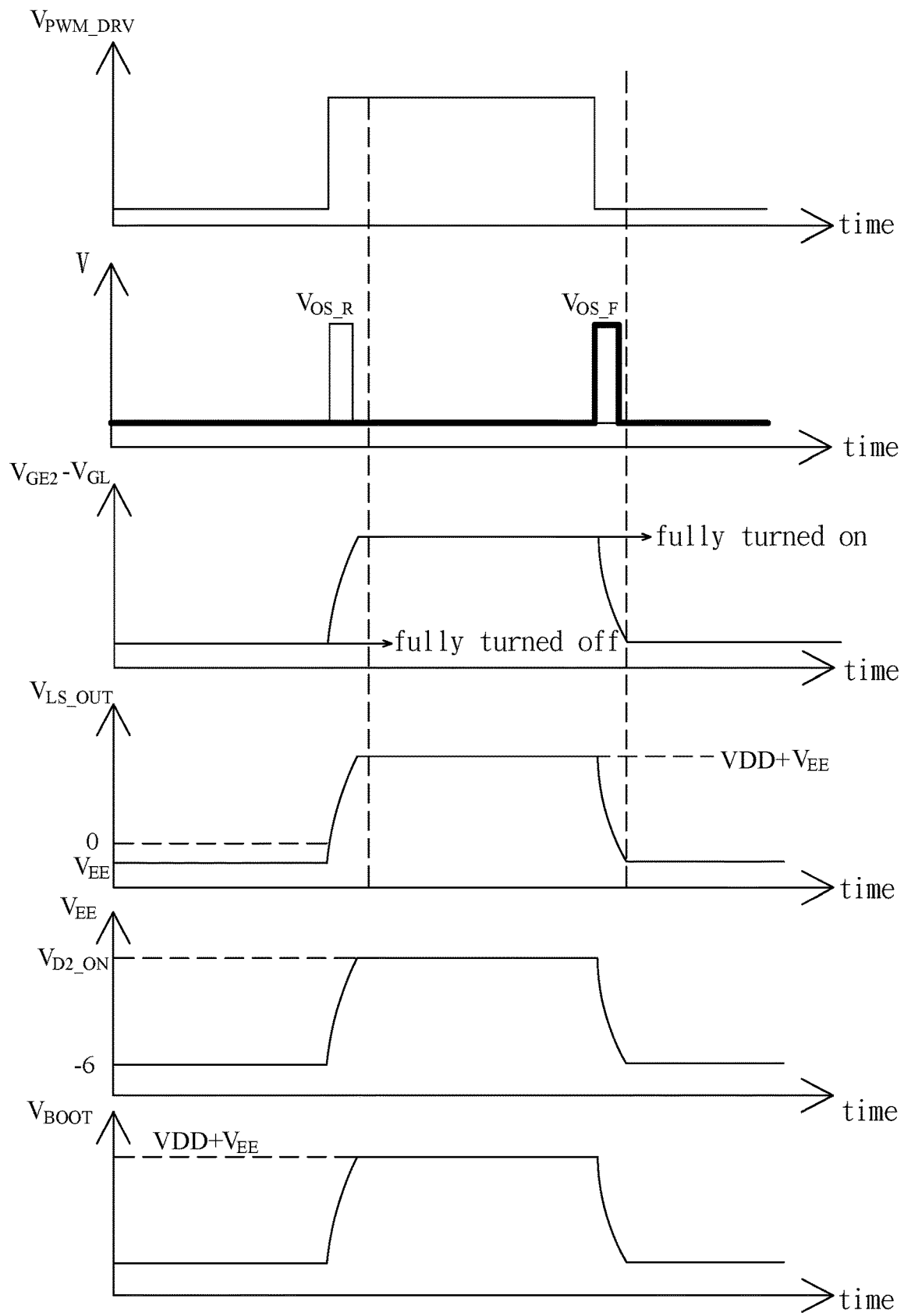
FIG. 7 is a diagram schematically illustrating the waveforms of signals shown in FIG. 6.

FIG. 7 is a diagram schematically illustrating the waveforms of signals shown in FIG. 6. Please refer to FIG. 6 and FIG. 7. When the PWM voltage signal $V_{PWM\_DRV}$ transitions from a low-level voltage to a high-level voltage, the controller 52 turns off the electronic switch 59, and the node voltage $V_{OS\_R}$ becomes a positive pulse voltage, so that the transistor of the left transition current sink 55 is turned on to pull down the node voltage $V_{GE1}$ and pull up the node voltage $V_{GE2}$. Therefore, the level shifter 50 generates an output voltage $V_{LS\_OUT}$ that transitions from the node voltage $V_{EE}$ to VDD+$V_{EE}$ to turn on the first N-channel MOSFET 61. The first high-voltage terminal charges the capacitor 51 through the first N-channel MOSFET 61, such that the node voltage $V_{EE}$ is equal to the turn-on voltage $V_{D2\_ON}$ of the second diode 60 as a non-negative voltage. Simultaneously, a positive voltage drop across the capacitor 51 is, for example, 6 volts. When the PWM voltage signal $V_{PWM\_DRV}$ transitions from a high-level voltage to a low-level voltage, the controller 52 turns on the electronic switch 59 and the node voltage $V_{OS\_F}$ becomes a positive pulse voltage, so that the transistor of the right transition current sink 55 is turned on to pull up the node voltage $V_{GE1}$ and pull down the node voltage $V_{GE2}$. Therefore, the level shifter 50 generates an output voltage $V_{LS\_OUT}$ that transitions from VDD+$V_{EE}$ to the node voltage $V_{EE}$ to turn off the first N-channel MOSFET 61. The capacitor 51 discharges the low-voltage terminal through the electronic switch 59. In order to maintain the original voltage across the capacitor 51, the node voltage $V_{EE}$ becomes -6 volts, which is used as a negative voltage. The second N-channel MOSFET 62 receives the negative voltage to turn off the FET 11.

The active diode bootstrap circuit 56 includes a capacitor, a transistor, and a comparator. The active diode bootstrap circuit 56 controls the high voltage $V_{BOOT}$ at 0 volt or VDD+$V_{EE}$. When the high voltage $V_{BOOT}$ is less than 0 volt, the comparator will turn on the transistor so that the high voltage $V_{BOOT}$ is controlled at 0 volt. When the gate voltage $V_{GL}$=$V_{EE}$, the high voltage $V_{BOOT}$ is equal to 0 volt and the voltage across the capacitor of the active diode bootstrap circuit 56 is $V_{EE}$. When the gate voltage $V_{GL}$-VDD, the high voltage $V_{BOOT}$ is controlled at VDD+$V_{EE}$.

Figure 8:
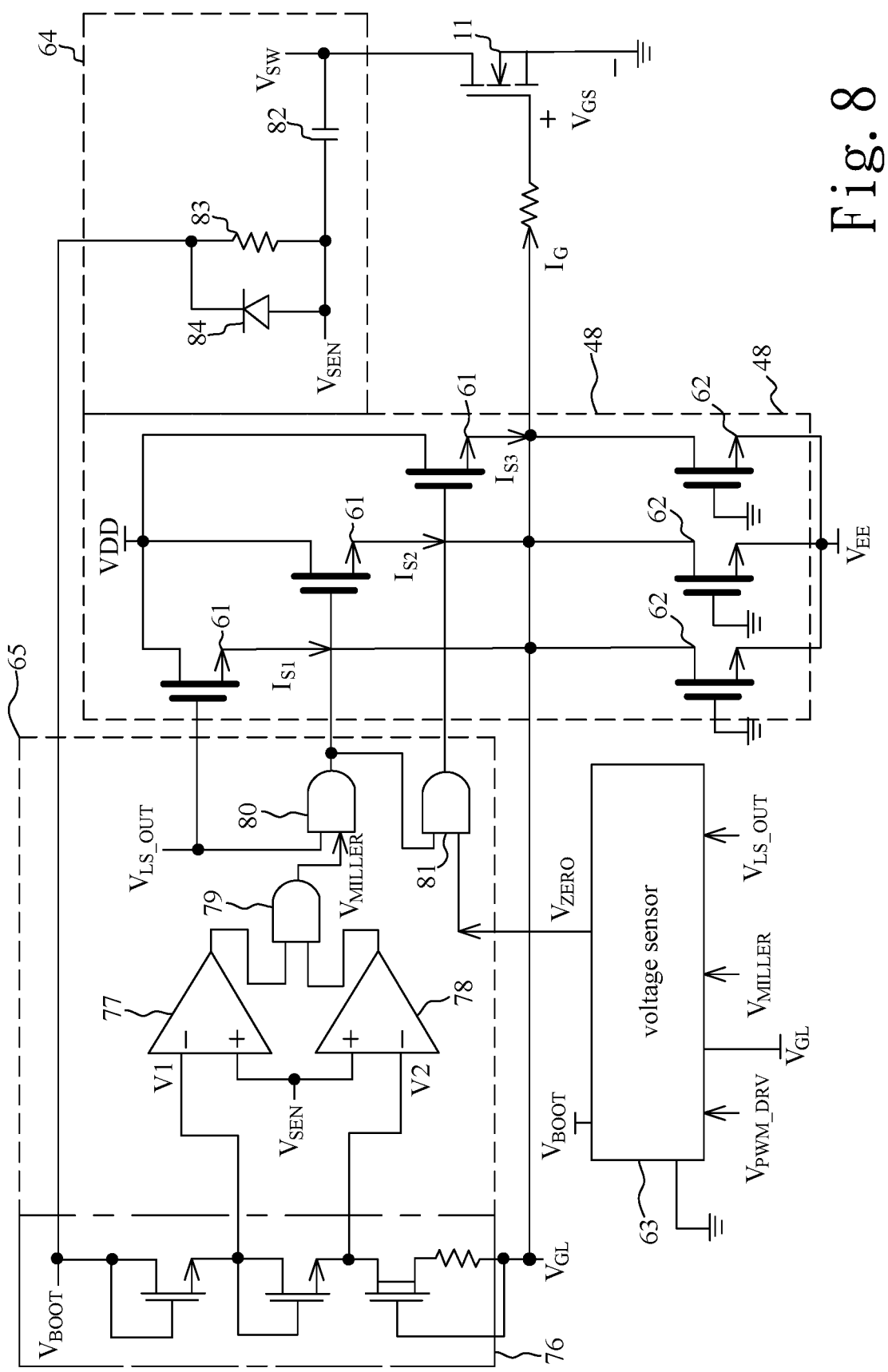
FIG. 8 is a diagram schematically illustrating a driving controller, a control circuit, a tracking circuit, and a voltage sensor according to an embodiment of the invention.

FIG. 8 is a diagram schematically illustrating a driving controller, a control circuit, a tracking circuit, and a voltage sensor according to an embodiment of the invention. Please refer to FIG. 2, FIG. 3, and FIG. 8. In order to prevent the ringing effect from occurring on the FET 11, the driving circuit device further includes a voltage sensor 63, a voltage tracker 64, and a control circuit 65, wherein the transistors used in the voltage sensor 63 and the control circuit 65 can be enhancement mode or depletion mode GaN-based MOSFETs, but the invention is not limited thereto. The voltage sensor 63 is coupled to the first comparator 39, the level shifter 50, the gate of the FET 11, a second high voltage terminal having the high voltage $V_{BOOT}$, and the low voltage terminal. The voltage tracker 64 is coupled to the drain of the FET 11 and the second high-voltage terminal. The control circuit 65 is coupled to the gate of the FET 11, the second high-voltage terminal, the level shifter 50, the voltage sensor 63, and the driving controller 48. In the embodiment, the driving controller 48 includes three first N-channel metal-oxide-semiconductor field-effect transistors 61 and three second N-channel metal-oxide-semiconductor field-effect transistors 62. The three first N-channel metal-oxide-semiconductor field-effect transistors 61 are respectively coupled to the three second N-channel metal-oxide-semiconductor field-effect transistors 62 in series.

Figure 9:
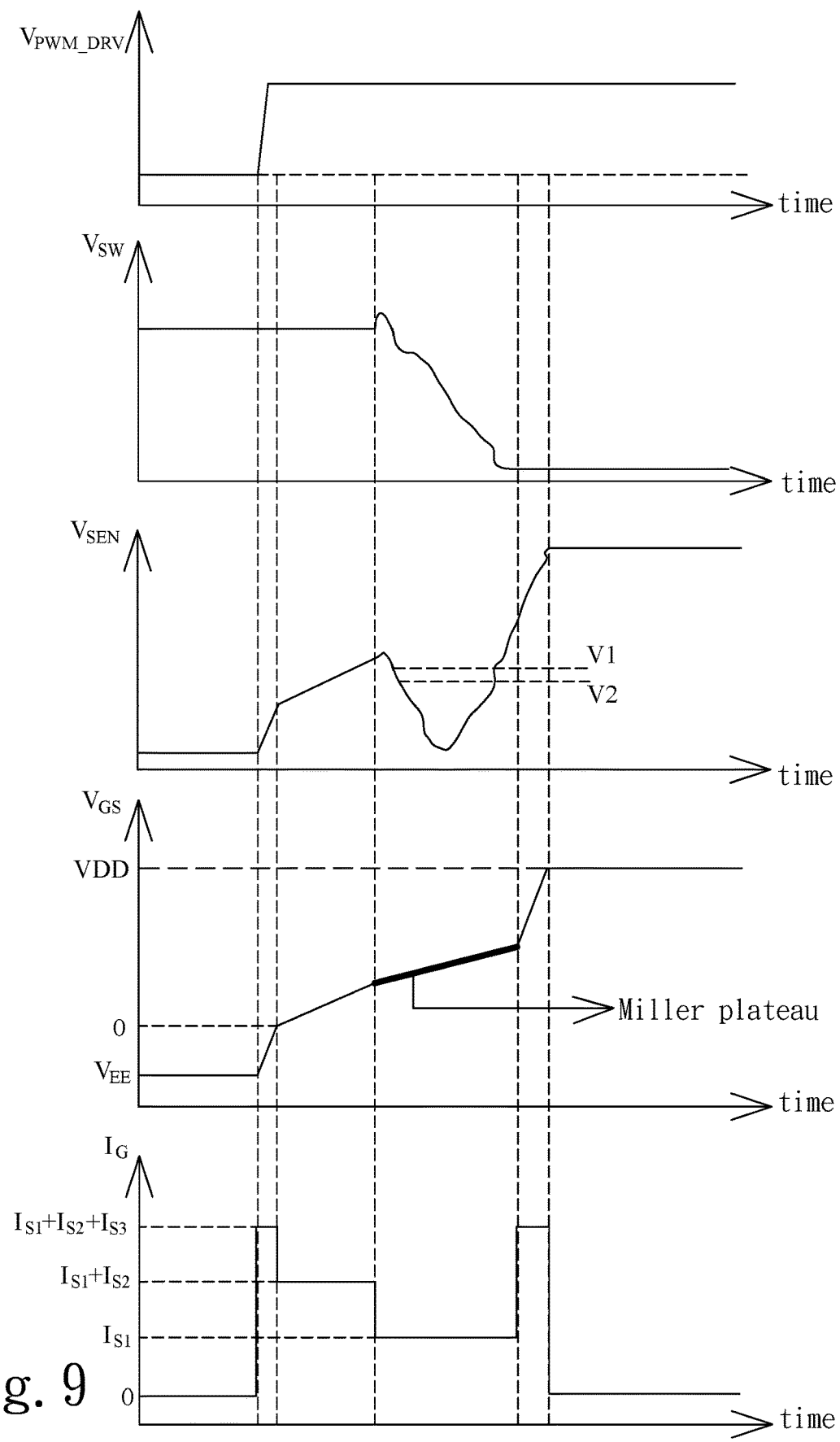
FIG. 9 is a diagram schematically illustrating the waveforms of signals shown in FIG. 8.

FIG. 9 is a diagram schematically illustrating the waveforms of signals shown in FIG. 8. Referring to FIG. 8 and FIG. 9, the voltage sensor 63 is coupled to the high voltage $V_{BOOT}$ of the second high-voltage terminal, the low voltage of the low-voltage terminal, the gate voltage $V_{GL}$ of the FET 11, the PWM voltage signal $V_{PWM\_DRV}$, and the output Voltage $V_{LS\_out}$ of the level shifter 50. The voltage tracker 64 is coupled to the drain voltage $V_{SW}$ of the FET 11 and the high voltage $V_{BOOT}$ of the second high-voltage terminal. The driving controller 48 generates a supplying current $I_G$ to increase the gate voltage $V_{GL}$ of the FET 11. The voltage tracker 64 generates a sensing voltage $V_{SEN}$ according to the drain voltage $V_{SW}$ and the high voltage $V_{BOOT}$ of the second high-voltage terminal. Because the FET 11 has not entered the Miller plateau, the FET 11 is not fully turned on. Thus, the sensing voltage $V_{SEN}$ tracks the high voltage $V_{BOOT}$. The control circuit 65 is coupled to the high voltage $V_{BOOT}$ of the second high-voltage terminal, the gate voltage $V_{GL}$, the output voltage $V_{LS\_out}$, and the sensing voltage $V_{SEN}$. When the PWM voltage signal $V_{PWM\_DRV}$ is a low-level voltage, the supplying current $I_G$ is 0 and the gate-source voltage $V_{GS}$ of the FET 11 is a negative voltage as the node voltage $V_{EE}$, so that the FET 11 is turned off. When the PWM voltage signal $V_{PWM\_DRV}$ transitions from the low-level voltage to the high-level voltage, the first N-channel MOSFET 61 and the second N-channel MOSFET 62 are both turned on, the supplying current $I_G=I_{S1}+I_{S2}+I_{S3}$, and the gate voltage $V_{GL}$ starts to rise. $I_{S1}$, $I_{S2}$, or $I_{S3}$ represents a current that passes through one first N-channel MOSFET 61 and one second N-channel MOSFET 62 connected in series. When the gate voltage $V_{GL}$ is greater than the grounding voltage as the low voltage, the voltage sensor 63 generates a turn-off voltage, which is used as a zero detection voltage $V_{ZERO}$. When the control circuit 65 receives the turn-off voltage, the control circuit 65 controls the driving controller 48 to decrease the supplying current $I_G$ from a first current value to a second current value. The first current value includes $I_{S1}+I_{S2}+I_{S3}$ and the second current value includes $I_{S1}+I_{S2}$. Since the FET 11 is turned on, the drain voltage $V_{SW}$ descends to decrease the sensing voltage $V_{SEN}$. When the sensing voltage $V_{SEN}$ is lower than the first voltage, the FET 11 starts to enter the Miller plateau. In order to avoid the ringing effect, when the sensing voltage $V_{SEN}$ is lower than a first voltage V1, the control circuit 65 controls the driving controller 48 to reduce the supplying current $I_G$ to a third current value $I_{S1}$ lower than the second current value. Since the sensing voltage $V_{SEN}$ is also affected by the high voltage $V_{BOOT}$, the high voltage $V_{BOOT}$ will increase the sensing voltage $V_{SEN}$ after the sensing voltage $V_{SEN}$ descends. When the sensing voltage $V_{SEN}$ is greater than the first voltage V1, the control circuit 65 and the voltage sensor 63 control the driving controller 48 to generate the supplying current $I_G$ of the first current value to suppress the ringing effect and reduce power consumption until the gate-source voltage of FET 11 is equal to the high voltage VDD of the first high-voltage terminal.

Figure 10:
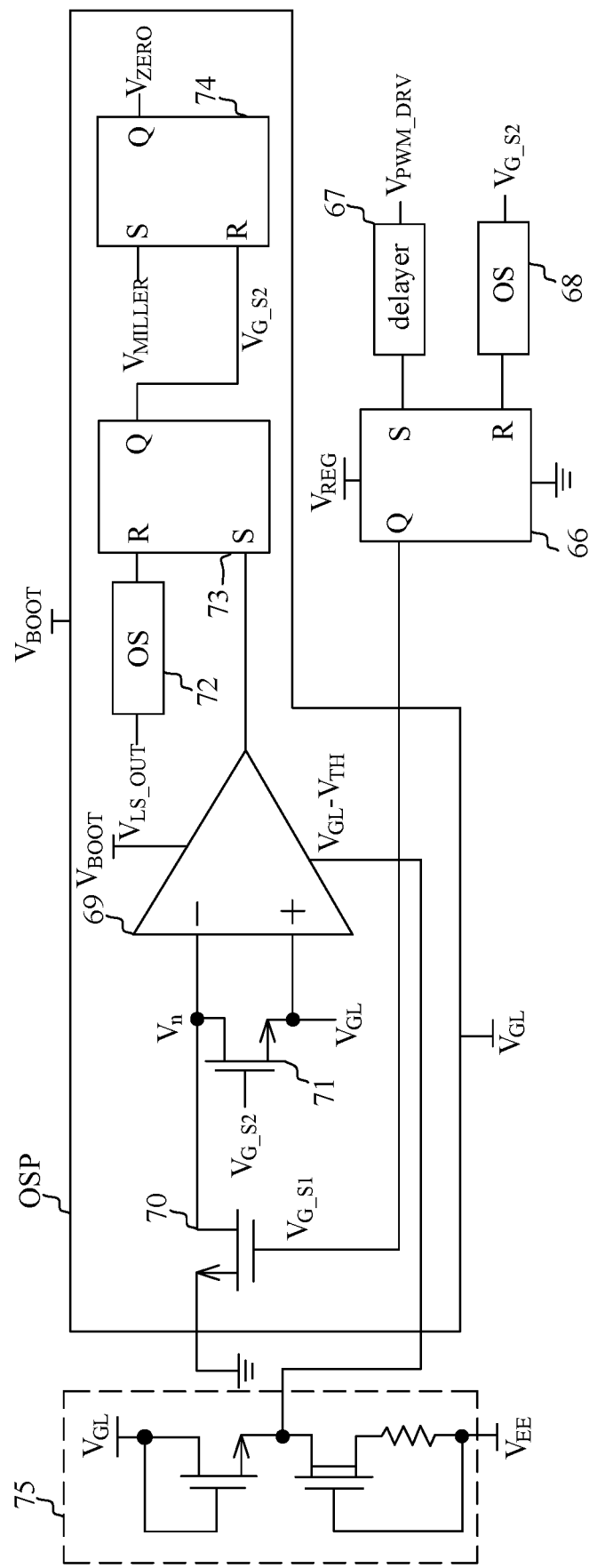
FIG. 10 is a diagram schematically illustrating a voltage sensor according to an embodiment of the invention.

FIG. 10 is a diagram schematically illustrating a voltage sensor according to an embodiment of the invention. Referring to FIG. 2, FIG. 3, FIG. 8, and FIG. 10, the voltage sensor 63 may include a first SR flip-flop 66, a delayer 67, a first one-shot (OS) circuit 68, a second comparator 69, a first electronic switch 70, a second electronic switch 71, a second one-shot (OS) circuit 72, a second SR flip-flop 73, a third SR flip-flop 74, and a voltage-dividing circuit 75. The delayer 67 is coupled to the first comparator 39 and the S input of the first SR flip-flop 66 and coupled to the PWM voltage signal $V_{PWM\_DRV}$. The delayer 67 is configured to prevent the S input and the R input of the first SR flip-flop 66 from simultaneously receiving the high-level voltage. The first OS circuit 68 is coupled to the R input of the first SR flip-flop 66. The second comparator 69 is coupled to the second high-voltage terminal, wherein the positive input of the second comparator 69 is coupled to the gate of the FET 11 and coupled to the gate voltage $V_{GL}$. The first electronic switch 70 is coupled between the low voltage terminal and the negative input of the second comparator 69. The control terminal of the first electronic switch 70 is coupled to the Q output of the first SR flip-flop 66. The second electronic switch 71 is coupled between the negative input and the positive input of the second comparator 69. The second OS circuit 72 is coupled to the level shifter 50 and coupled to the output voltage $V_{LS\_out}$ of the level shifter 50. The S input of the second SR flip-flop 73 is coupled to the output terminal of the second comparator 69. The R input of the second SR flip-flop 73 is coupled to the second OS circuit 72. The S input of the third SR flip-flop 74 is coupled to the control circuit 65. The R input terminal of the third SR flip-flop 74 is coupled to the Q output of the second SR flip-flop 73, the control terminal of the second electronic switch 71, and the first OS circuit 68. The Q output of the third SR flip-flop 74 is coupled to the control circuit 65 and configured to generate the zero detection voltage $V_{ZERO}$, such as a turn-off voltage. The first SR flip-flop 66 is coupled to the high voltage $V_{REG}$ and the grounding voltage. The first OS circuit 68 is coupled to the voltage $V_{G\_S2}$ output from the Q output of the second SR flip-flop 73. The S input and the R input of the third SR flip-flop 74 are respectively coupled to voltages $V_{MILLER}$ and $V_{G\_S2}$. The control terminal of the first electronic switch 70 is coupled to the voltage $V_{G\_S1}$ output from the Q output of the first SR flip-flop 66. The negative input of the second comparator 69 is coupled to a voltage $V_n$. The voltage-dividing circuit 75, coupled to gate voltage $V_{GL}$ and the node voltage $V_{EE}$, provides the voltage $V_{GL}$-VTH for the second comparator 69. VTH is the threshold voltage of the field-effect transistor of the voltage-dividing circuit 75. When the FET 11 is turned on, the gate voltage $V_{GL}$ and the high voltage $V_{BOOT}$ will affect the input common-mode range (ICMR) of the second comparator 69. If the gate voltage $V_{GL}$ and the grounding terminal as the low voltage terminal are directly coupled to the input of the second comparator 69, the over-stress problem will occur after the field effect transistor 11 is fully turned on. Therefore, it is necessary to provide additional overstress protection for the second comparator 69. The second comparator 69, the first electronic switch 70, the second electronic switch 71, the second OS circuit 72, the second SR flip-flop 73, and the third SR flip-flop 74 form an overstress protection circuit OSP, which is coupled to the high voltage $V_{BOOT}$ and the gate voltage $V_{GL}$.

The control circuit 65 may include a voltage-dividing circuit 76, a third comparator 77, a fourth comparator 78, a first AND gate 79, a second AND gate 80, and a third AND gate 81. The voltage-dividing circuit 76 is coupled to the second high-voltage terminal and the gate of the FET 11 and coupled to the gate voltage $V_{GL}$ and the high voltage $V_{BOOT}$ of the second high-voltage terminal. The voltage-dividing circuit 76 is configured to provide the first voltage V1 and a second voltage V2 smaller than the first voltage V1. The negative input of the third comparator 77 is coupled to the voltage-dividing circuit 76 and coupled to the second voltage V2. The positive input of the third comparator 77 is coupled to the voltage tracker 64 and coupled to the sensing voltage $V_{SEN}$. The negative input of the fourth comparator 78 is coupled to the voltage-dividing circuit 76 and coupled to the first voltage V1. The positive input of the fourth comparator 76 is coupled to the voltage tracker 64 and coupled to the sensing voltage $V_{SEN}$. The inputs of the first AND gate 79 are coupled to the outputs of the third comparator 77 and the fourth comparator 78. The output of the first AND gate 79 is coupled to the S input of the third SR flip-flop 74 and configured to output the voltage $V_{MILLER}$. The inputs of the second AND gate 80 are coupled to the output of the first AND gate 79 and the level shifter 50 and coupled to the output voltage $V_{LS\_out}$. The output of the second AND gate 80 is coupled to the driving controller 48. The inputs of the third AND gate 81 are coupled to the voltage sensor 63 and the output of the second AND gate 80. The output of the third AND gate 81 is coupled to the driving controller 48. The input of the third AND gate 81 is coupled to the zero detection voltage $V_{ZERO}$.

The voltage tracker 64 may include a capacitor 82, a resistor 83, and a diode 84. The capacitor 82 has a first end and a second end. The first end is coupled to the positive inputs of the third comparator 77 and the fourth comparator 78 and coupled to the sensing voltage $V_{SEN}$. The second end of the capacitor 82 is coupled to the drain of the FET 11 and coupled to the drain voltage $V_{SW}$. The resistor 83 is coupled between the first end of the capacitor 82 and the second high-voltage terminal. The anode of the diode 84 is coupled to the first end of the capacitor 82 and the positive inputs of the third comparator 77 and the fourth comparator 78. The cathode of the diode 84 is coupled to the second high-voltage terminal and coupled to the high voltage $V_{BOOT}$ of the second high-voltage terminal. The capacitor 82 generates the sensing voltage $V_{SEN}$ at the first end of the capacitor 82 based on the drain voltage $V_{SW}$ and the high voltage $V_{BOOT}$ of the second high-voltage terminal.

Figure 11:
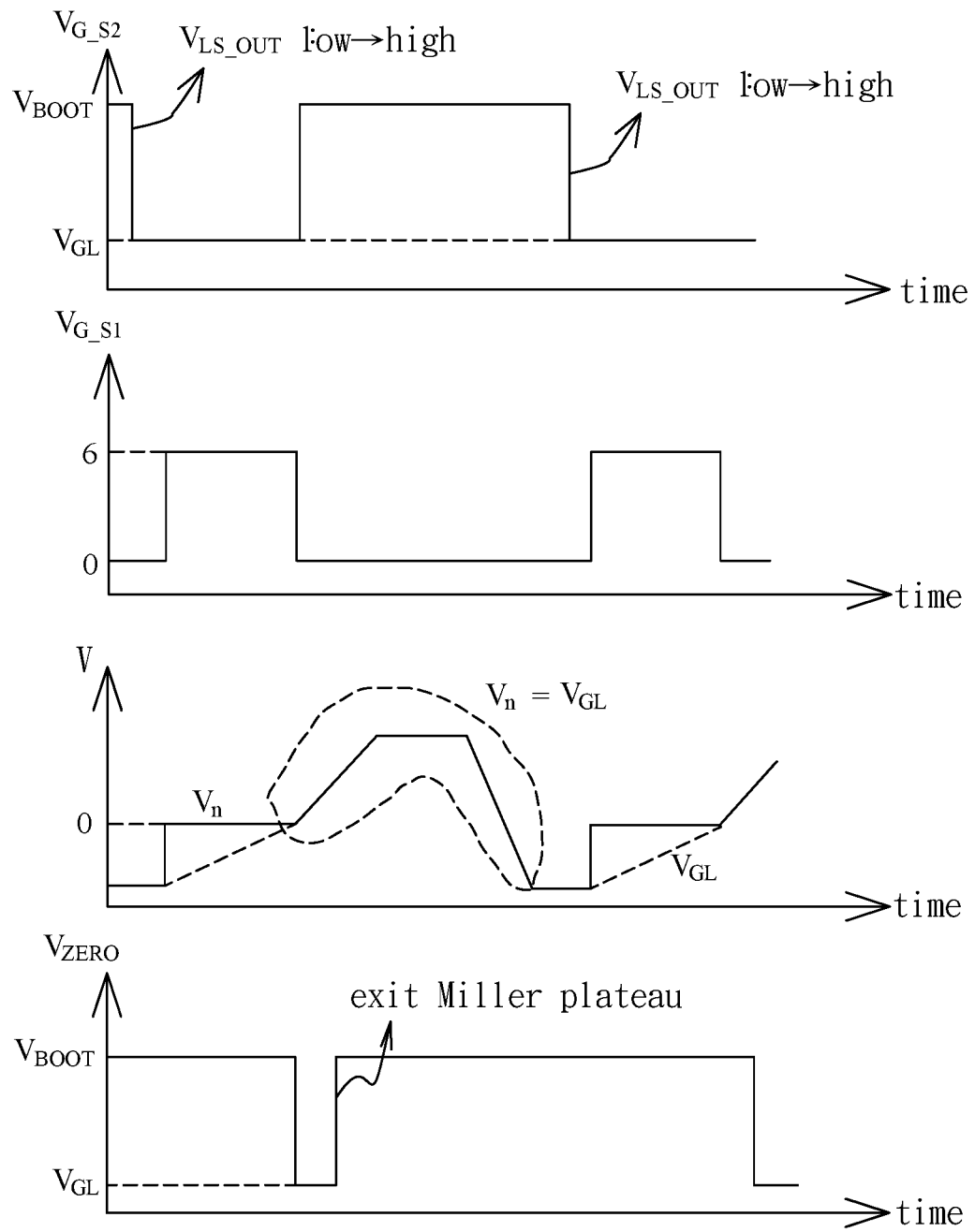
FIG. 11 is a diagram schematically illustrating the waveforms of signals shown in FIG. 10.

FIG. 11 is a diagram schematically illustrating the waveforms of signals shown in FIG. 10. Please refer to FIG. 10 and FIG. 11. When the PWM voltage signal $V_{PWM\_DRV}$ transitions from the low-level voltage to the high-level voltage, the output voltage $V_{LS\_out}$ transitions from the low-level voltage to the high-level voltage. Simultaneously, the voltage $V_{G\_S2}$ is a low-level voltage that turns off the second electronic switch 71 and the voltage $V_{G\_S1}$ is a high-level voltage that turns on the first electronic switch 70. Therefore, the voltage $V_n$ is equal to 0 and the gate voltage $V_{GL}$ rises from the negative voltage as the node voltage $V_{EE}$. When the gate voltage $V_{GL}$ is greater than the voltage $V_N$, the voltage $V_{G\_S2}$ is a high-level voltage that turns on the second electronic switch 71 and the voltage $V_{G\_S1}$ is a low-level voltage that turns off the first electronic switch 70. As a result, the voltage $V_n$ and the gate voltage $V_{GL}$ are equal and the zero detection voltage $V_{ZERO}$ drops from $V_{BOOT}$ to $V_{GL}$ as the turn-off voltage. When the sensing voltage $V_{SEN}$ is less than the first voltage, the voltage $V_{MILLER}$ is a low-level voltage, the FET 11 starts to enter the Miller plateau, and the zero detection voltage $V_{ZERO}$ is still equal to $V_{GL}$. Afterwards, when the sensing voltage $V_{SEN}$ is greater than the first voltage, the voltage $V_{MILLER}$ is a high-level voltage, the FET 11 starts to exit the Miller plateau, and the zero detection voltage $V_{ZERO}$ is equal to $V_{BOOT}$.

According to the embodiments provided above, the driving circuit device employs the CMCE circuits crossly coupled, the current mirrors of the current-to-voltage converter, the negative voltage generator, and the mechanism for determining the FET entering or exiting the Miller plateau to avoid the CMT disturbances, abnormally turning on the FET, and the ringing effect of the FET.

The embodiments described above are only to exemplify the invention and not to limit the scope of the invention. Therefore, any equivalent modification or variation according to the shapes, structures, features, or spirit disclosed by the invention is to be also included within the scope of the invention.

What is claimed is:

1. A driving circuit device, coupled to a field-effect transistor (FET), comprising:
   a first current source and a second current source configured to provide constant currents;
   a first common-mode current elimination (CMCE) circuit and a second common-mode current elimination (CMCE) circuit;
   a current-to-voltage converter comprising a first current mirror and a second current mirror, wherein a control terminal of the first current mirror coupled to the second CMCE circuit, a control terminal of the second current mirror coupled to the first CMCE circuit, the first current mirror coupled to the first current source, the second current mirror coupled to the second current source, the first CMCE circuit and the first current mirror coupled to a common-mode node through a first resistor, the second CMCE circuit and the second current mirror coupled to the common-mode node through a second resistor, and the first mirror and the second mirror configured to receive the constant currents, common-mode currents, and differential currents, thereby controlling the first CMCE circuit and the second CMCE circuit to generate a voltage difference that excludes a common-mode voltage corresponding to the common-mode currents; and
   a first comparator coupled to a gate of the FET, the first CMCE circuit, and the second CMCE circuit and configured to receive the voltage difference to drive the FET.

2. The driving circuit device according to claim 1, wherein each of the first CMCE circuit and the second CMCE circuit comprises three depletion mode GaN-based N-channel metal-oxide-semiconductor field-effect transistors coupled in series.

3. The driving circuit device according to claim 1, further comprising:
   a driving controller coupled to a first high-voltage terminal and the gate of the FET;
   a negative voltage generator, coupled to the driving controller and a low-voltage terminal, comprising a capacitor; and
   a level shifter coupled to the first comparator, the driving controller, and the negative voltage generator, wherein the first comparator is configured to generate a pulse width modulation (PWM) voltage signal according to the voltage difference and transmit the PWM voltage signal to the level shifter, when the PWM voltage signal is a high-level voltage, the level shifter drives the driving controller and the negative voltage generator to charge the capacitor, thereby generating a non-negative voltage, when the PWM voltage signal is a low-level voltage, the level shifter drives the negative voltage generator to discharge the capacitor, thereby generating a negative voltage, and the driving controller is configured to receive the negative voltage to turn off the FET.

4. The driving circuit device according to claim 3, wherein the negative voltage generator further comprises:
   a first diode with an anode thereof coupled to the driving controller and the FET;
   a resistor coupled between the capacitor and a cathode of the first diode;

an electronic switch with a control terminal thereof coupled to the level shifter, and the electronic switch is coupled between the cathode of the first diode and the low-voltage terminal; and a second diode with an anode thereof coupled to the driving controller and the capacitor, and a cathode of the second diode coupled to the low-voltage terminal, wherein when the PWM voltage signal is the high-level voltage, the level shifter turns off the electronic switch and drives the driving controller to charge the capacitor, and when the PWM voltage signal is the low-level voltage, the level shifter turns on the electronic switch to charge the capacitor.

5. The driving circuit device according to claim 4, wherein the driving controller comprises:

at least one first N-channel metal-oxide-semiconductor field-effect transistor (NMOSFET) with a gate thereof coupled to the level shifter, the at least one first NMOSFET coupled between the first high-voltage terminal and the gate of the FET, when the PWM voltage signal is the high-level voltage, the level shifter turns on the at least one first NMOSFET and the first high-voltage terminal charges the capacitor through the at least one first NMOSFET; and at least one second N-channel metal-oxide-semiconductor field-effect transistor (NMOSFET) with a gate thereof coupled to a grounding terminal, the at least one second NMOSFET coupled between the capacitor and the gate of the FET, wherein when the PWM voltage signal is the low-level voltage, the at least one second NMOSFET receives the negative voltage to turn off the FET.

6. The driving circuit device according to claim 4, wherein the at least one first NMOSFET and the at least one second NMOSFET are enhancement mode GaN-based N-channel metal-oxide-semiconductor field-effect transistors (NMOSFET).

7. The driving circuit device according to claim 3, further comprising:

a voltage sensor coupled to the first comparator, the level shifter, the gate of the FET, a second high-voltage terminal, and the low-voltage terminal and coupled to a high voltage of the second high-voltage terminal, a low voltage of the low-voltage terminal, a gate voltage of the FET, the PWM voltage signal, and an output voltage of the level shifter, when the PWM voltage signal transitions from the low-level voltage to the high-level voltage, the gate voltage starts to rise, and when the gate voltage is greater than the low voltage, the voltage sensor generates a turn-off voltage;

a voltage tracker coupled to a drain of the FET and the second high-voltage terminal, coupled to a drain voltage of the FET and the high voltage of the second high-voltage terminal, and configured to generate a sensing voltage according to the drain voltage and the high voltage of the second high-voltage terminal; and a control circuit coupled to the gate of the FET, the second high-voltage terminal, the level shifter, the voltage sensor, and the driving controller, wherein the driving controller configured to generate a supplying current to increase the gate voltage of the FET, the control circuit coupled to the high voltage of the second high-voltage terminal, the gate voltage, the output voltage, and the sensing voltage, when the control circuit receive the turn-off voltage, the control circuit controls the driving controller to decrease the supplying current from a first current value to a second current value, when the sensing voltage is less than a first voltage, the control circuit controls the driving controller to decrease the supplying current to a third current value less than the second current value, and when the sensing voltage is greater than the first voltage, the control circuit and the voltage sensor control the driving controller to generate the supplying current of the first current value until a gate-source voltage of the FET is equal to the high voltage of the first high-voltage terminal.

8. The driving circuit device according to claim 7, wherein the voltage sensor comprises:

a first SR flip-flop;

a delayer coupled to the first comparator and an S input of the first SR flip-flop and coupled to the PWM voltage signal;

a first one-shot (OS) circuit coupled to an R input of the first SR flip-flop;

a second comparator coupled to the second high-voltage terminal, wherein a positive input of the second comparator is coupled to the gate of the FET and coupled to the gate voltage;

a first electronic switch coupled between the low-voltage terminal and a negative input of the second comparator, and a control terminal of the first electronic switch is coupled to a Q output of the first SR flip-flop;

a second electronic switch coupled between the negative input and the positive input of the second comparator;

a second one-shot (OS) circuit coupled to the level shifter and coupled to the output voltage of the level shifter;

a second SR flip-flop with an S input thereof coupled to an output of the second comparator, and an R input of the second SR flip-flop is coupled to the second OS circuit; and a third SR flip-flop with an S input thereof coupled to the control circuit, an R input of the third SR flip-flop coupled to a Q output of the second SR flip-flop, a control terminal of the second electronic switch, and the first OS circuit, and a Q output of the third SR flip-flop coupled to the control circuit and configured to generate the turn-off voltage.

9. The driving circuit device according to claim 8, wherein the control circuit comprises:

a voltage-dividing circuit coupled to the second high-voltage terminal and the gate of the FET, coupled to the gate voltage and the high voltage of the second high-voltage terminal, and configured to provide the first voltage and a second voltage less than the first voltage;

a third comparator with a negative input thereof coupled to the voltage-dividing circuit and coupled to the second voltage, and a positive input of the third comparator coupled to the voltage tracker and coupled to the sensing voltage;

a fourth comparator with a negative input thereof coupled to the voltage-dividing circuit and coupled to the first voltage, and a positive input of the fourth comparator coupled to the voltage tracker and coupled to the sensing voltage;

a first AND gate with inputs thereof coupled to outputs of the third comparator and the fourth comparator, and an output of the first AND gate coupled to an S input of the third SR flip-flop;

a second AND gate with inputs thereof coupled to the output of the first AND gate and the level shifter and coupled to the output voltage, and an output of the second AND gate coupled to the driving controller; and a third AND gate with inputs thereof coupled to the voltage sensor and the output of the second AND gate, and an output of the third AND gate coupled to the driving controller.

10. The driving circuit device according to claim 9, wherein the voltage tracker comprises:

a capacitor having a first end and a second end, the first end coupled to the positive inputs of the third comparator and the fourth comparator, and the second end coupled to the drain of the FET and coupled to the drain voltage;

a resistor coupled between the first end and the second high-voltage terminal; and a diode with an anode thereof coupled to the first end and the positive inputs of the third comparator and the fourth comparator, a cathode of the diode coupled to the second high-voltage terminal and coupled to the high voltage of the second high-voltage terminal, and the capacitor configured to generate the sensing voltage at the first end according to the drain voltage and the high voltage of the second high-voltage terminal.

* * * * *